July 12, 1966 J. F. GREGORY 3,260,912

POWER AMPLIFIER EMPLOYING PULSE DURATION MODULATION

Filed June 19, 1963 2 Sheets-Sheet 1

INVENTOR.
James F. Gregory
BY
Paul J. Ethington
ATTORNEY

INVENTOR.
James F. Gregory
BY
Paul J. Ethington
ATTORNEY

United States Patent Office 3,260,912

Patented July 12, 1966

3,260,912

POWER AMPLIFIER EMPLOYING PULSE DURATION MODULATION

James F. Gregory, Woodland Hills, Calif., assignor to General Motors Corporation, Detroit, Mich., a corporation of Delaware Filed June 19, 1963, Ser. No. 289,079
10 Claims. (Cl. 318—341)

This invention relates to power amplifiers and, more particularly, to a power amplifier which is operable in a pulse duration modulation technique to supply bi-directional D.C. power to a load.

A primary objective in the design of a power supply or power amplifier is to improve the efficiency of the system. Increased efficiency results in reduced weight which is of great importance in many applications. More efficient operation is also a desirable characteristic of power amplifier operation in that the normal result is an increase in the lifetime of active amplifier components. This longer life is the result of less dissipation of power in the amplifier and decreased heating. Advantages which follow from decreased dissipation of power in the amplifier are relaxation of requirements for overheating prevention and heat sinking. Prior art amplifiers such as the conventional class B D.C. power amplifiers, when analyzed on the basis of a comparison of power lost versus power delivered to the load normally, exhibits a maximum power loss at approximately one-fourth power output. Consequently, operation at this point results in considerable power loss and attendant heating.

It is, thus, an objective of the present invention to provide a power amplifier having a high efficiency which is substantially independent of the operating point. In general, this is accomplished by means of a pulse duration modulation technique in the operation of active output elements in the amplifier. In this operation technique, power modulating circuit elements, such as transistors, are operated in a switching mode; that is, they are either fully conductive or fully nonconductive, and little time is spent in switching from one condition to the other.

In accordance with the invention, energy from a unidirectional supply source is applied to a load in a modulated fashion such that three distinct states are possible. In the first state, substantially the full potential of the supply may be applied across the load in a positive direction. In the second state, the load is shorted out, and in the third state, substantially the full supply potential is applied across the load in a negative direction. Furthermore, the period of time which is spent in any of the one possible output states may be varied relative to the time spent in the other two states. Accordingly, the D.C. primary supply source is modulated in application to the load to provide constant frequency pulses, the duty cycle and polarity of which are related to the character of a predetermined input signal quantity. In general, this is accomplished by the provision of an output stage employing active elements such as transistors in a configuration which provides two energy paths of opposite direction to a load from a single source. In addition, detector and logic means are associated with the active elements of the output stage to provide a switching operation which occurs at a predetermined rate as defined by a source of time base signals. The detector means are adapted to receive an error signal which varies over a predetermined range to affect, through the logic means, the operation of the output stage so as to interdependently vary the time durations of the three output states mentioned above. Accordingly, the D.C. source is applied in alternately opposite directions across the load with varying time durations such that the net power delivered to the load may be varied in opposite senses. When associated with proper feedback means, the pulse duration modulation is performed in such a manner as to reduce the error signal.

A more complete understanding of the invention may be obtained by reading the following specification which is to be taken with the accompanying drawings in which.

Figure 1:
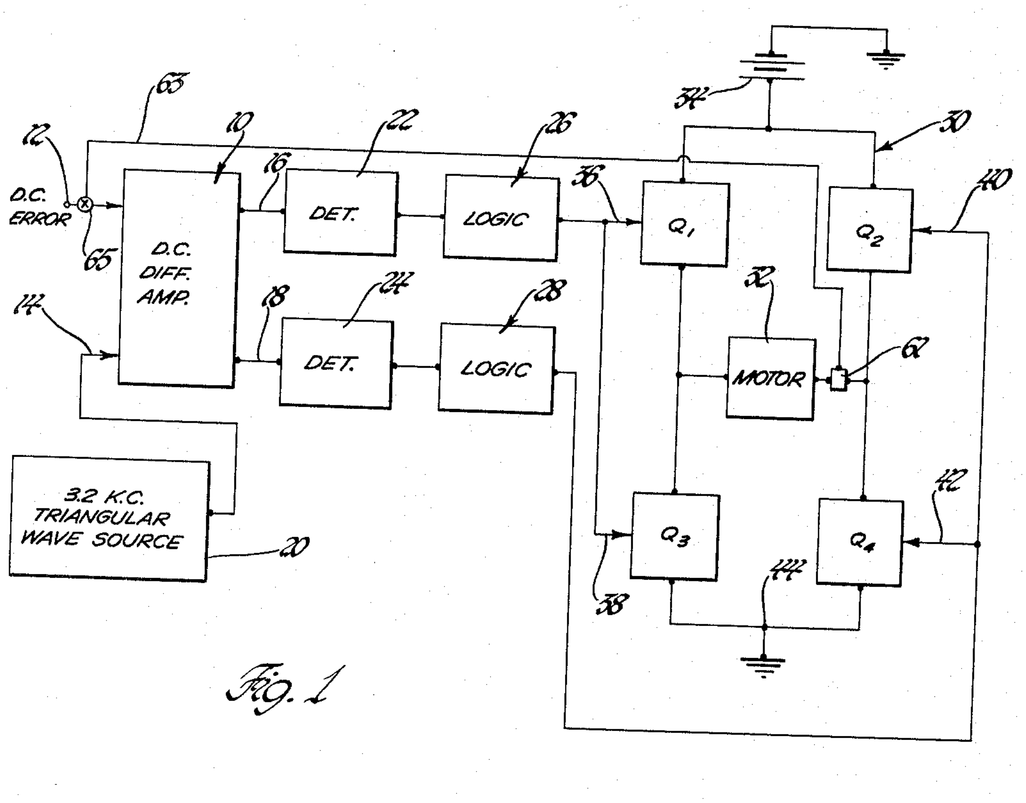
FIGURE 1 is a block diagram of an illustrative embodiment of the present invention.

In describing the invention with reference to FIGURE 1, it may be assumed that the subject amplifier is used to supply modulated power to a reversible load in accordance with the character of a command signal. In a more specific sense, it may be assumed that it is desired to supply time-modulated voltage pulses to a reversible D.C. torque motor which is used to control the position or displacement of a primary body such as a gyroscope gimbal. Displacement of the primary body from a predetermined position is effective through suitable means, not shown, to generate a D.C. error signal which varies in polarity and magnitude according to the direction and magnitude of the displacement.

Accordingly, the invention as illustrated in FIGURE 1, includes a D.C. differential amplifier 10 having inputs 12 and 14 and outputs 16 and 18. Input 12 is connected to receive a D.C. signal which varies in magnitude and polarity over a predetermined range. As previously suggested, this D.C. signal may be generated by a displacement signal generator and, thus, represent a displacement error. Input 14 of the differential amplifier 10 is connected to a waveform generator 20 which is adapted to produce a triangular voltage waveform having a constant frequency in this instance of 3.2 kc. The object of the differential amplifier 10 is to effectively combine the D.C. error signal on input 12 with the triangular waveform appearing on input 14 so as to provide an output signal at 16 which corresponds to the instantaneous sum of the signals on inputs 12 and 14. Similarly, the output signal appearing on 18 corresponds to the inverse of the sum of the D.C. signal and the triangular waveform. The signals appearing on outputs 16 and 18 are applied to respective level crossing detectors 22 and 24. The detectors 22 and 24 are essentially gating devices which are adapted to produce an output signal only when the input signal thereto exceeds a predetermined bias level as defined by a voltage level sensor within the detector. The output of detector 22 is connected into a logic circuit 26 which is adapted to produce control signals in response to the output of the detector 22. Similarly, the output of detector 24 is connected into a logic circuit 28 which corresponds to circuit 26. The outputs of the logic circuits 26 and 28 are connected into an output stage generally designated at 30. The output stage 30 includes switching means in the form of our active circuit elements which, in this case, are referred to as transistors Q1, Q2, Q3 and Q4. The transistors are connected in an H configuration across a load 32 which may be a reversible D.C. motor. The transistors Q1, Q2, Q3 and Q4 are adapted to operate in a pulse duration modulation mode to regulate the application of energy from a source 34 across the load 32 in opposite directions as will become more apparent in the following. The input circuits 36 and 38 for transistors Q1 and Q3 are connected to receive the output of logic circuit 26 as indicated. Similarly, logic circuit 28 is connected to the input circuits 40 and 42 of transistors Q2 and Q4 respectively. The output circuits for the transistors include a path from the positive terminal of source 34, the load 32 and a point 44 which is grounded as indicated.

In accordance with the invention, the active elements of the output stage 30 are controlled by the magnitude and polarity of the D.C. error signal appearing on input 12 of D.C. amplifier 10 and the subsequent detector and logic circuits to provide three conditions in the output stage 32 which may be interdependently varied. The first condition corresponds to the application of the voltage from source 34 across the load 32 in what shall be termed a positive direction. This condition obtains by controlling the conductivity of the active elements such that Q1 and Q4 are simultaneously conductive, while Q2 and Q3 are nonconductive. Accordingly, a signal path through load 32 is defined as running from the positive terminal of source 34 through the output circuit of Q1, the load 32 and the output circuit of Q4 to ground 44. The second condition corresponds to a short circuit of the load 32 and obtains when transistors Q1 and Q2 are nonconductive while transistors Q3 and Q4 are conductive. Accordingly, with transistors Q3 and Q4 conductive, both sides of the load 32 are connected to the ground point 44. The third condition corresponds to the application of the voltage from source 34 across the load 32 in what is termed a negative direction. This condition obtains when transistors Q2 and Q3 are conductive, while transistors Q1 and Q4 are nonconductive. In this instance a current path through the load 32 is defined as running from the positive terminal of source 34 through the output circuit of transistor Q2, the load 32 and the output circuit of transistor Q3 to the ground point 44. It can be seen that in either of the first or third conditions with the active elements fully conductive and/or nonconductive, the full voltage from source 44 is applied across the load 32, resulting in a highly efficient operation and a minimum dissipation of power in the active elements. As will be further described in the following, the application of a sloping waveform such as the instant triangular wave to a gating device such as detectors 22 and 24 provides time modulation of resulting output signals inasmuch as the portion of the sloping waveform which exceeds the gate threshold level is related to the D.C. level of the sloping waveform.

Figure 2:
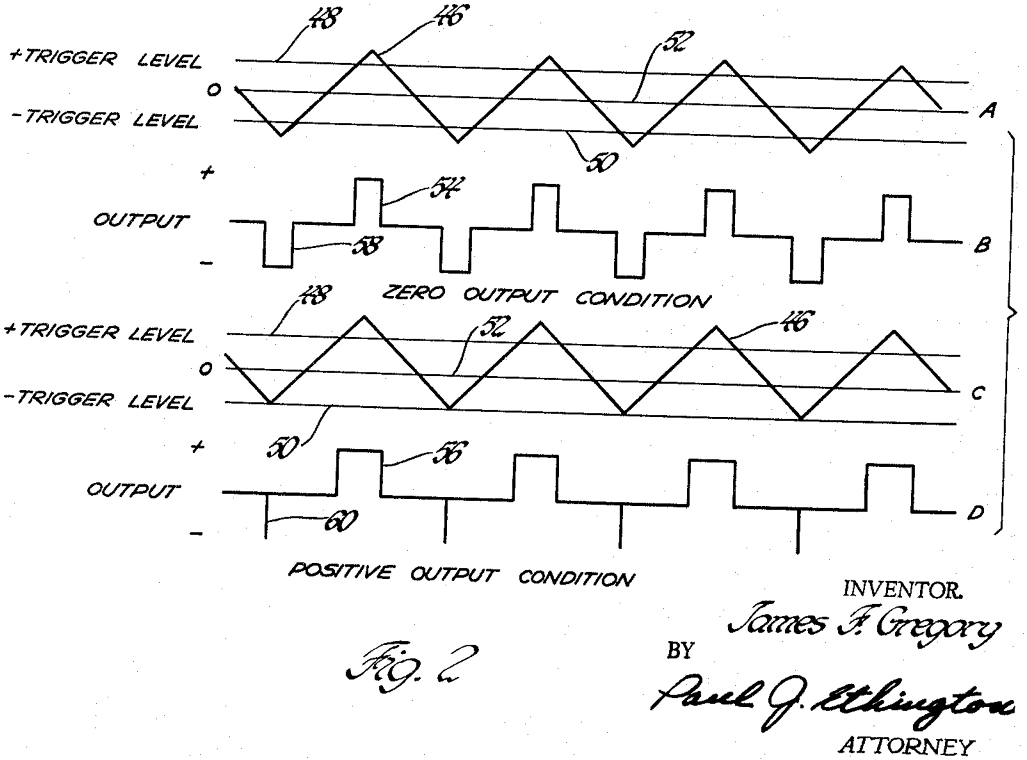
FIGURE 2 is a graph of illustrative waveforms which indicate the nature of the output of the invention power amplifier.

The illustrative waveforms of FIGURE 2 are helpful in describing the operation of the invention as shown in FIGURE 1. Referring to FIGURE 2, Line A, the triangular waveform 46 is shown superimposed upon a positive trigger level 48 and a negative trigger level 50. The triangular waveform 46 is shown centered about the zero or reference level 52 indicating that the D.C. error signal which is added to the triangular waveform from source 20 is zero. The positive trigger level 48 corresponds to the threshold level of the crossing level detector 22 which must be exceeded by the signal on output 16 in order to produce an output from the detector 22. The peak-to-peak amplitude of the triangular wave 46 is selected to be slightly greater than double the amplitude of the positive trigger level 48. Accordingly, when the D.C. error signal is zero the triangular waveform appearing on output 16 exceeds the positive trigger level for only a small portion of time corresponding to the peak portion of the triangular waveform.

The negative trigger level 50 corresponds to that which is set in crossing level detector 24 and which must be exceeded by the signal appearing on output 18 before the detector 24 will produce an output signal. FIGURE 2A is, therefore, a composite representation of the nature of the input waveforms to each of the detectors 22 and 24. The relationship of the triangular waveform 46 with the positive trigger level 48 is representative of the input signal to detector 22, while the relationship of the triangular waveform 46 with respect to the negative trigger level 50 corresponds with the nature of the inverse signal which is applied to detector 24. It can be seen that the effect of the D.C. differential amplifier 10 is to combine the D.C. error signal with the triangular waveform and provide a constant frequently triangular waveform riding on a veriable D.C. level to each of the detectors 22 and 24 in such a manner that the detectors are individually responsive to positive and negative signal levels.

As will be apparent from a consideration of the invention in its entirety, the trigger levels 48 and 50 may be varied over a range to provide any desired zero error conditions. For example, both levels 48 and 50 may coincide with the reference level 52 if the output characteristic resulting from this condition is desired. This imposes a practical limitation in that the switching times of the transistors Q1, Q2, Q3 and Q4 may be too slow to follow the switching causing a current surge from source 34. This condition is to be avoided. Similarly, levels 48 and 50 may be greater than shown.

When the threshold level of detector 22 is exceeded by the positive portion of the triangular waveform 46, the detector produces an output pulse. This output pulse is represented at 54 in FIGURE 2B. It may be seen that the width or duration of the pulse 54 corresponds with the width of the portion of the triangular waveform 46 which exceeds the positive trigger level 48. Accordingly, an increase in the D.C. error signal in the positive direction causes the triangular waveform which rides thereon to move positively, thus, increasing the portion of the waveform 46 which exceeds the positive trigger level 48. This is indicated in FIGURE 2C. Accordingly, a pulse 56 of greater duration than pulse 54 is generated by detector 22. In a similar fashion, the portion of the combined waveform in FIGURE 2A which exceeds the negative trigger level 50, as determined by the bias in detector 24, is effective to produce a pulse 58 at the output of the detector 24. A negative increase in the D.C. error signal causes the waveform 46 which rides thereon to be increased in negative direction, thus, increasing the portion of the wave which exceeds the negative trigger level. Referring again to FIGURES 2C and 2B, it can be seen that a positive increase in the D.C. error signal is effective not only to increase the duration of the positive pulse 56 from detector 22 but also decreases the duration of the pulse from detector 24. In FIGURES 2C and 2D, a negative pulse 60 has been reduced to a minimum width. Note also that during the major porition of the triangular wave 46, neither of the levels 48 and 50 are exceeded and, accordingly, no pulse is produced by either of the outputs of the detectors 22 or 24. The overall result of a variation in the D.C. error signal is, thus, a pulse duration modulation of the output from detectors 22 and 24. The nature of the change in the pulse duration time from detectors 22 and 24 is essentially reciprocal; that is, an increase in the duration of the pulse output of one results in a decrease in the pulse duration of the output of the other.

The pulse outputs of the detectors 22 and 24 are respectively delivered to the logic circuits 26 and 28. The effect of the logic circuits is to apply appropriate signals to the input circuits of the transistors associated therewith to control the conductivity of the transistors. As will subsequently appear, transistors Q3 and Q4 are biased so as to be normally conductive in the absence of any signals from the logic circuits 26 and 28. Therefore, during the intermediate period where the triangular waveform 46 exceeds neither the positive nor negative trigger levels, transistors Q3 and Q4 are conductive, effectively shorting out the load 32. This corresponds with the second condition or state defined previously. If the levels 48 and 50 are decreased as suggested above, it follows that the time duration of the second condition decreases accordingly. An increase in either or both of the levels has the opposite effect.

Upon the occurrence of a signal from circuit 26 into the input circuits 36 and 38, transistor Q1 will be biased conductive and Q3 nonconductive. At this time transistor Q4 remains conductive and transistor Q2 remains nonconductive inasmuch as no signal output is provided by the combination of detector 24 and logic circuit 28. Therefore, transistors Q1 and Q4 are simultaneously conductive to realize the current path corresponding with the first condition as previously described. The source 34 is, thus, applied in the first direction across the load 32. In the event the load 32 takes the form of a reversible D.C. motor, current flow through the motor will tend to move it in one direction.

Upon the occurrence of a signal from the combination of detector 24 and logic 28, transistor Q2 is biased on and Q4, which is normally biased on, will be biased off. Similarly, transistor Q3 will remain on and Q1 will remain off inasmuch as no signal appears from the combination of the detector 22 and logic 26. Therefore, the third output condition obtains and a current path is described through the load 32 in the opposite direction from that which obtained under the first condition. Controlled voltage reversal through the load has, thus, been obtained from the single D.C. source 34.

In the equilibrium or zero error condition shown in FIGURES 2A and 2B, it is noted that the pulses corresponding to 54 and 58 alternately appear from driver circuits 26 and 28 at a frequency of 3.2 kc., corresponding to that of the triangular waveform 46. Accordingly, a voltage reversal occurs with respect to the load 32 at this frequency. Where the load 32 is of an inductive nature as, for example, in the case of a D.C. motor armature, the energy storing capacity of the load tends to smooth out the alternating pulses and be responsive to the average value. It is apparent that the average value of the alternate pulses 54 and 58 of FIGURE 2B is zero. Accordingly, where the load 32 may be taken to represent a D.C. torque motor having a fairly large time constant, the average effective current flow through the armature is zero. Since torque is a function of current rather than voltage, the torque motor will remain at a standstill.

If, as for example appears in FIGURE 2C, the D.C. error signal on input 12 of differential amplifier 10 increases in the positive direction so as to increase the duration of pulses produced by logic 26 and decrease the duration of pulses produced by logic 28, it can be seen that the period of conductivity for transistors Q1 and Q4 will be longer than that of the transistors Q2 and Q3. Therefore, the average value of the voltage pulses appearing in FIGURE 2D tends to assume a positive value. Where the load is, as previously explained, a D.C. motor armature, a net current flow exists tending to move the motor in one direction. Should the D.C. error signal swing negatively, the motor would first stop and then move in the opposite direction to effect a reversal of the motor. In the normal application, the output which is of a mechanical nature of the load motor is interconnected by suitable feedback means with the D.C. error signal generator such that a closed loop circuit or system is provided.

It may be desirable from a motor control standpoint to employ additional feedback circuitry for the purpose of shaping the torque error voltage characteristic of the system. A non-linearity may appear in the vicinity of the zero error range which may undesirably affect output conditions. One manner of correcting this effect is shown in FIGURE 1 to entail the addition of a current sensor 61 in series with the armature of the motor load 32. This current sensor is connected via feedback path 63 to a differential adding device 65 through which input 12 is connected to the amplifier 10. The current sensor 61 senses current which continues to flow through the load in a particular direction and adds a signal proportional thereto to the D.C. error signal to avoid any small error signal versus torque discontinuity.

Referring now to the more detailed diagram of FIGURE 3, a description of the circuit and the operation thereof will be made. As will subsequently appear, the schematic diagram of FIGURE 3 corresponds with the block diagram of FIGURE 1. Accordingly, the D.C. differential amplifier 10 comprises a pair of NPN transistors 62 and 64, the collectors of which are commonly connected to a positive supply voltage as indicated. The base electrode of transistor 62 is connected to input 12 to receive the D.C. error signal. Similarly, the base electrode of transistor 64 is connected through input 14 to the source 20 of the 3.2 kc. triangular waveform. This connection is made through a low impedance capacitor 66. It is apparent that the differential amplifier 10 is of conventional form in which the emitter electrodes of the transistors 62 and 64 are connected through respective resistors 68 and 70, to a common negative supply source as indicated. The differential amplifier outputs 16 and 18 are respectively taken from the collector electrodes of transistors 62 and 64 and are interconnected with the crossing level detectors 22 and 24 respectively. Crossing level detectors 22 and 24 are respectively made up of a pair of NPN transistors 72 and 74, the emitter electrodes of which are commonly connected to a 12 volt positive source which imposes the threshold level values 48 and 50 on the detectors 22 and 24. The differential outputs 16 and 18 are interconnected with the base electrodes of the transistors 72 and 74. The crossing level detectors 22 and 24, as previously indicated, are switched from an off condition to an on condition whenever the input to the transistors 72 and 74 exceeds the emitter voltage, which in this case is indicated as +12 volts. Inasmuch as the crossing level detectors are being fed by the differential amplifier 10, only one of the crossing level detectors may be switched on at any time. The collector electrode of transistor 72 which makes up crossing level detector 22 is interconnected via conductor 76 with the base electrode of a PNP transistor 78 which is included in the logic circuit designated 26 in FIGURE 1. Transistor 78 serves as a switching amplifier and signal inverter and supplies signals to the subsequent circuit components. The emitter of transistor 78 is interconnected with a positive high voltage supply source and the collector is connected to the base electrode of a driver transistor 80 by a diode 82 and a series connected resistor 84. The collector of transistor 78 is also connected via a steering diode 86 to the base electrode of a switching transistor 88. The collector electrode of driver transistor 80 is also connected to a positive voltage supply as indicated. The emitter electrode is connected to the base electrode of transistor Q1 via an input circuit 36. Switching transistor 88 has the emitter thereof connected to a low potential positive supply and the collector is connected through a resistor 90 to the base electrode of a second driver transistor 92 which is an NPN transistor. The collector of transistor 92 is also connected to the positive supply while the emitter electrode is connected via input circuit 38 to the base electrode of transistor Q3. Transistors Q1 and Q3, as was previously indicated in FIGURE 1, are connected through the respective output circuits thereof across the supply source 34. A pair of diodes 94 and 96 are respectively connected across the emitter to collector circuits of transistors Q1 and Q3 for purposes to be described in the following.

The collector electrode of transistor 74 in crossing level detector 24 is connected via a conductor 98 and resistor 99 to the base electrode of a PNP transistor 100 which also serves as a switching amplifier and signal inverter corresponding to that same function performed by transistor 78. Transistor 100 and the subsequent circuitry to be described makes up the interior details of the logic circuit 28 shown in FIGURE 1. It is apparent that the configuration of logic circuit 28 corresponds exactly with the circuitry of logic circuit 26. Accordingly, the emitter electrode of transistor 100 is also connected to a positive voltage supply, while the collector electrode is connected to respective diodes 102 and 104 to the base electrodes of transistors 106 and 108. Transistor 108 also serves as a switching amplifier and signal inverter to the driver transistor 110. The collector electrode of driver transistor 106 is connected to the positive high voltage supply and the emitter electrode is connected to the base electrode of transistor Q2 via input circuits 40. Similarly, the collector electrode of driver transistor 110 is connected to the low voltage positive supply while the emitter electrode is connected by input circuit 42 to the base electrode of transistor Q4. Diodes 112 and 114 are also connected across the emitter collector circuits of transistors Q2 and Q4. The load arrangement 32 is connected across points 116 and 118. Point 116 corresponds with the junction between the emitter and collector of transistors Q1 and Q3 respectively, while point 118 corresponds with the junction between the emitter and collector of transistors Q2 and Q4 respectively. As indicated the load arrangement may consist of the reactive and resistive components of a torque motor armature.

Figure 3:
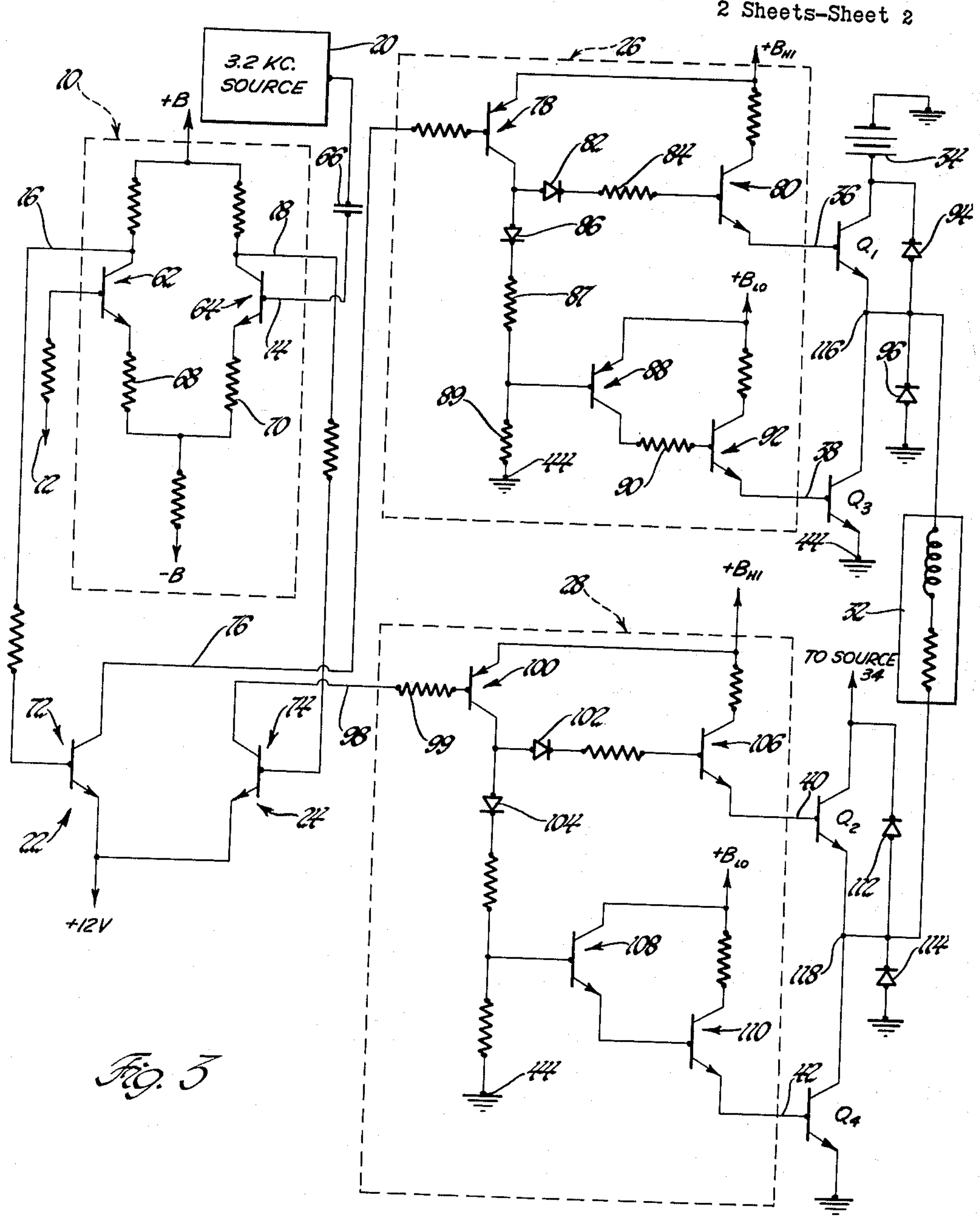
FIGURE 3 is a detailed schematic diagram of the particular embodiment as shown in FIGURE 1.

Describing now the operation of the circuit of FIGURE 3, the output of source 20 and the variable D.C. signal input are simultaneously fed into the differential amplifier 10 which is effective to produce on outputs 16 and 18 respective signals corresponding to the sum and the inverse of the sum of the two input signals. During the portion of time that the amplitude of the combined waveform is less than the threshold level as indicated in FIGURE 2, the level crossing detectors 22 and 24 produce no output and the circuit is in the second condition as defined above. Accordingly, neither transistors 72 nor 74 are conductive. In this state the transistor 78 cannot conduct and the collector thereof is grounded through diode 86 to point 44. The base electrode of transistor 88 is, thus, effectively forward biased with respect to the positive supply source on the emitter such that the resulting emitter to base bias current starts transistor 88 into saturation. The base to emitter current through transistor 88, as a result, raises the forward bias across resistor 90 so that transistor 92 goes into a saturated condition of conduction. At this point the base to emitter bias of output transistor Q3 is raised via input circuit 38 so that Q3 is also driven into conduction. Since transistor 74 of level crossing detector 24 also produces no output during the intermediate stage of condition 2 as defined above, it can be shown that through transistors 100, 108 and 110 transistor Q4 also is biased into conduction. Accordingly, during the second condition, transistors Q3 and Q4 are conductive to effectively short out the load arrangement 32.

In condition number 1, recall that the positive potential of the combined signal exceeds the threshold level 48 and the differential amplifier 10 effects the saturation or conduction of transistor 72 of the crossing level detector 22. With transistor 72 in a saturated condition, the potential at the collector thereof is lowered to the reference potential such that the forward emitter to base bias of transistor 78 is further increased until transistor 78 is also in full conduction. The potential of the positive supply, thus, appears at the collector of transistor 78 and serves to increase the forward bias of transistor 80 to drive that transistor into saturation. With transistor 80 conductive or in saturation, the base to emitter juncion of transistor Q1 in the output stage is forward biased and is, therefore, conductive from the supply source 34 through the collector and emitter thereof. At the same time transistor 80 becomes conductive, the bias on transistor 88 is reversed biased due to the positive potential of the supply source appearing on the collector of transistor 70. Transistor 88 is, thus, cut off to, in turn, cut off driver transistor 92 and output transistor Q3. In this manner, it may be seen that transistors Q1 and Q3 may only be complementarily conductive and as soon as transistor Q1 is turned on, transistor Q3 is turned off. This action is effected by the appearance of an output signal on conductor 76 from the crossing level detector 22. At this point it should be noted that the diodes 82 and 86 assist in assuring the complementary and independent operation of transistors Q1 and Q3. While Q1 is conductive and Q3 is non-conductive, there is a small amount of emitter to base current through transistor 88 from the positive supply source thereof. This current is forced to go to ground across resistor 89 rather than flowing through resistor 87, diode 82 and resistor 84 to the base of transistor 80 where the conductivity thereof might be affected. Diode 104 corresponds with diode 86. Diodes 82 and 102 similarly prevent emitter base currents through transistors 80 and 106 from reaching the bases of transistors 88 and 108 respectively.

The third condition which was defined previously, obtains when the inverse of the combination of the triangular waveform in the D.C. error signal exceeds the negative trigger level 50. From the fact that the 12 volt bias on detector 24 is in reality positive, it is obvious that level 50 is termed negative to indicate that detector 24 responds to the inverse of the sum of the triangular wave and the D.C. error signal. At this time crossing level detector 24 consisting of transistor 74 is rendered conductive to produce an output signal on conductor 98 which is transmitted to the base of the switching transistor 100. Inasmuch as the logic circuitry 28 is similar to that of logic circuit 26, a similar action occurs to that as described above. Accordingly, the production of an output signal on conductor 98 is effective to turn transistor Q4 off and turn transistor Q2 on in a complementary fashion. Therefore, it follows that since the crossing level detectors 22 and 24 may only be conductive separately and never simultaneously due to the operation of the differential amplifier 10, the output circuit consisting of transistors Q1 through Q4 will always be in one of the three above-defined conditions.

Due to the inductive nature of the load arrangement 32 in the case of a D.C. reversible motor, switching or alternations between the first and third output stage conditions at a high frequency will result in a retention of energy in the output load 32. This energy retention or hysteresis will prevent the motor from following exactly the voltage reversal across the load and it is possible that while the source is switched across the load in one direction, current may persist in the other direction for a short time. To provide the required bilateral current flow capability, diodes 94, 96, 112 and 114 are connected across the output electrodes of transistors Q1 through Q4 as indicated. Thus, if transistors Q2 and Q3 are rendered non-conductive corresponding with the third condition, while current persists in flowing from right to left in the load as shown in FIGURE 1, the diodes 114 and 94 provide a path for the flow of such current.

It is to be understood that the particular embodiments which have been described in detail are not to be taken in a limiting sense, but are only illustrative of one means of implementing the present invention. Accordingly, various modifications and changes may be made in the invention without departing from the scope and spirit thereof as defined by the appended claims.

What is claimed is:

1. A power amplifier for applying energy to a load in response to a relatively slowly varying signal quantity comprising: generator means to produce a relatively rapidly varying signal quantity having a sloping waveform; means to combine the slowly varying and rapidly varying signal quantities to provide first and second alternately occurring output signals of opposite character which vary in magnitude in accordance with variations in the slowing varying signal quantity; detector means connected to receive the first and second output signals and to produce first and second pulse trains, the pulses of which vary in duration in proportion to the magnitude of the first and second output signals respectively; a source of energy; controlled switching means connecting the source to the load and actuable to provide first and second energy paths of opposite direction across the load; and means operatively connected intermediate the switching means and the detector means to actuate the switching means to provide said first path in response to the pulses of the first train and to provide said second path in response to the pulses of the second train.

2. A power amplifier for applying energy to a load in response to a variable D.C. signal comprising: a source for producing a constant frequency signal of triangular waveform; means to combine the constant frequency signal with the D.C. signal to provide first and second alternately occurring output signals; the first output signal corresponding to the sum of the D.C. signal and the constant frequency signal and the second output signal corresponding to the inverse of said sum; gating means connected to receive the first and second output signals and to transmit only the portion of the signals which exceed a predetermined signal level; a source of energy; controlled switching means connecting the source to the load and responsive to signals of a first character to apply the source across the load in a first direction and responsive to signals of a second character to apply the source across the load in a second direction; and control means connected intermediate the switching means and the gating means to apply signals of the first character to the switching means whenever the first output signal exceeds the predetermined level and to apply signals of the second character to the switching means whenever the second output signal exceeds the predetermined level.

3. A power amplifier for applying energy to a load in response to a variable signal quantity comprising: circuit means having an input connected to receive the variable signal quantity and two outputs on which are produced first and second pulse trains, the pulses of which reciprocally vary in duration in proportion to the variations in the variable signal quantity, the pulses in the first train occurring intermediate pulses in the second train; a source of energy; output means including first switching means interconnecting the source and the load and separately actuable to define a first energy path in one direction across the load and second switching means interconnecting the source and the load and separately actuable to define a second energy path in the opposite direction across the load; means connecting the first pulse train to the first switching means thereby to actuate the switching means for variable duration corresponding to the duration of the pulses; and means connecting the second pulse train to the second switching means thereby to actuate the second switching means for durations which vary reciprocally with the durations of actuation of the first switching means.

4. The combination as defined in claim 3 wherein the load is a reversible D.C. motor responsive to the direction of energy applied thereto to tend to rotate in a corresponding direction.

5. The combination as defined in claim 4 wherein the motor has a time constant which is larger than the rate of occurrence of the pulses whereby the motor responds only to the average value of the energy applied thereto.

6. A power amplified for modulating the application of energy to a load in response to variations in a variable amplitude D.C. command signal comprising: means to combine the D.C. command signal with an alternating waveform and to compare the combination thereof with first and second threshold levels of opposite polarity; first and second detector means to produce first and second pulses which vary in duration according to the portion of the said combination which exceeds the first and second threshold levels respectively; a D.C. energy source; output means including first and second pairs of transistors, each pair having the output electrodes thereof connected in series across the D.C. source; a load connected between the junctions intermediate the first and second transistor pairs; first logic means connecting the output of the first detector means to the first transistor pair and responsive to the first pulses to complementarily energize the transistors of said first pair and second logic means connecting the output of the second detector to the second transistor pair and responsive to the second pulses to complementarily energize the transistors of said second pair whereby the D.C. source is applied across the load in one direction in response to the first pulses and in the opposite direction in response to the second pulses.

7. A power amplifier for controlling the energy to a load in response to a D.C. signal of variable magnitude and polarity comprising: means to generate a substantially constant frequency signal of triangular waveform; means to combine the constant frequency signal with the D.C. signal to provide a first combined signal corresponding to the sum of the signals and a second combined signal corresponding to the inverse of the sum; individual detector means connected to receive the first and second combined signals and to produce respective output pulses corresponding in duration to the width of the portion of said sum and inverse signals which exceed predetermined threshold levels; an output circuit comprising a source of unidirectional voltage; a first pair of transistors serially connecting the source and the load, and being on opposite sides of the load; a second pair of transistors serially connecting the source and the load and being on opposite sides of the load, the first pair of transistors being energizable to apply the source across the load in one direction and the second pair of transistors being energizable to apply the source across the load in the opposite direction; and logic means connecting the output pulses of the first and second detectors respectively to the first and second pairs of transistors to effect the energization thereof.

8. The combination as defined by claim 7 wherein said logic means includes: means to render a selected one of the transistors in each pair normally energized thereby to short out the load during such portion of the first and second combined signals which do not exceed the predetermined threshold levels, the means being responsive to the output pulses to energize the remaining transistor of each pair.

9. A power amplifier circuit comprising: a load; a source of unidirectional electrical energy; a first pair of transistors having input and output electrodes, the output electrodes thereof being connected in series with the source and the load and on opposite sides of the load to define a first energy path through the load when conductive; a second pair of transistors having input and output electrodes, the output electrodes thereof being connected in series with the source and the load and on opposite sides of the load to define, when conductive, a second energy path through the load opposite in direction to the first path; means normally maintaining selected ones of the first and second transistor pairs which are on opposite sides of the load in a conductive state thereby to short out the load; means normally maintaining the remaining transistors in a nonconductive state; first control means connected to the input electrode of one transistor in each pair which transistors are of opposite normal conductivity, the control means being responsive to signals of a first character to reverse the conductivity of the transistors connected therewith to complete said first energy path; second control means connected to the input electrodes of the other transistor in each pair and responsive to signals of a second character to reverse the conductivity of the transistors thereby to complete the second energy path; and means for alternately providing signals of said first and second character to the first and second control means respectively, for durations which are related to a preselected variable.

10. Apparatus as defined in claim 9 including respective diodes connected across the output electrodes of the transistors to provide for bilateral current flow through each of the first and second energy paths.

References Cited by the Examiner

UNITED STATES PATENTS

| | | | |
|---|---|---|---|
| 3,054,067 | 9/1962 | Merrill et al. | 330—13 X |
| 3,078,379 | 2/1963 | Plogstedt et al. | 307—88.5 |
| 3,174,058 | 3/1965 | Xylander | 307—88.5 |
| 3,175,211 | 3/1965 | Lee et al. | |

ORIS L. RADER, *Primary Examiner.*

J. C. BERENZWEIG, *Assistant Examiner.*